United States Patent
Aoki et al.

(10) Patent No.: US 8,829,623 B2
(45) Date of Patent: Sep. 9, 2014

(54) SEMICONDUCTOR MEMORY DEVICE

(75) Inventors: Nobutoshi Aoki, Yokohama (JP);
Takashi Izumida, Yokohama (JP);
Masaki Kondo, Yokohama (JP);
Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 530 days.

(21) Appl. No.: 12/248,483

(22) Filed: Oct. 9, 2008

(65) Prior Publication Data
US 2009/0101960 A1    Apr. 23, 2009

(30) Foreign Application Priority Data
Oct. 10, 2007 (JP) ................ P2007-263985

(51) Int. Cl.
*H01L 27/088* (2006.01)
*H01L 27/115* (2006.01)

(52) U.S. Cl.
CPC .... *H01L 27/11529* (2013.01); *H01L 27/11526* (2013.01); *H01L 27/11524* (2013.01)
USPC ............. 257/392; 438/217; 438/276

(58) Field of Classification Search
CPC .................................. H01L 27/11529
USPC ......................... 438/427; 257/392
See application file for complete search history.

(56) References Cited

U.S. PATENT DOCUMENTS

| | | | | |
|---|---|---|---|---|
| 5,472,906 A | * | 12/1995 | Shimizu et al. | ............ 438/445 |
| 2004/0092115 A1 | * | 5/2004 | Hsieh et al. | ............ 438/694 |
| 2005/0047261 A1 | * | 3/2005 | Kai et al. | ............ 365/232 |
| 2006/0035437 A1 | | 2/2006 | Mitsuhira et al. | |
| 2007/0004167 A1 | | 1/2007 | Lee | |

FOREIGN PATENT DOCUMENTS

| | | |
|---|---|---|
| JP | 11-163303 | 6/1999 |
| JP | 2005-268336 | 9/2005 |
| JP | 2006-41397 | 2/2006 |
| JP | 2006-80492 | 3/2006 |
| JP | 2007-13074 | 1/2007 |
| JP | 2007-110029 | 4/2007 |

OTHER PUBLICATIONS

Japanese Office Action issued Sep. 11, 2012, in Japan patent application No. 2007-263985 (with English translation).

* cited by examiner

*Primary Examiner* — Ajay K Arora
(74) *Attorney, Agent, or Firm* — Oblon, Spivak, McClelland, Maier & Neustadt, L.L.P.

(57) ABSTRACT

According to an aspect of the present invention, there is provided a semiconductor memory device including: a semiconductor substrate having: a contact region; a select gate region; and a memory cell region; a first element isolation region formed in the contact region and having a first depth; a second element isolation region formed in the select gate region and having a second depth; and a third element isolation region formed in the memory cell region and having a third depth which is smaller than the first depth.

20 Claims, 12 Drawing Sheets

SEMICONDUCTOR MEMORY DEVICE

CROSS-REFERENCE TO RELATED APPLICATIONS

This application claims priority from Japanese Patent Application No. 2007-263985 filed on Oct. 10, 2007, the entire contents of which are incorporated herein by reference.

BACKGROUND OF THE INVENTION

JP-2005-268336-A discloses a semiconductor device in which a diffusion region is provided around a boundary between an SOI (Silicon on Insulator) region and a non-SOI region, and field isolation regions are provided on both sides of the diffusion region. The field isolation region is not provided around the boundary, thereby preventing a void from being generated.

JP-2006-80492-A discloses a semiconductor device in which a depth of a device isolation groove in a memory cell region is set smaller than a depth of a device isolation groove in a peripheral circuit region, thereby uniforming a height of the device isolation region in the memory cell region and the peripheral circuit region. Since a step of STI (Shallow Trench Isolation) is relaxed, a conductive film is prevented from being remained against etching, and a lower film is prevented from being excessively etched.

JP-2007-13074-A discloses a method for manufacturing a semiconductor device in which a depth of an element isolating trench in a cell region is formed smaller than a depth of an element isolating trench in a peripheral region, thereby preventing a thinning phenomenon of a gate oxide film in the peripheral region and a hump phenomenon that leak current flows into a low-voltage element.

JP-2006-41397-A discloses a method for manufacturing a semiconductor device by uniforming the heights of element isolation regions from the surface of a semiconductor substrate, when an insulating film is buried in different depth grooves to form the element isolation regions.

SUMMARY OF THE INVENTION

According to an aspect of the present invention, there is provided a semiconductor memory device including: a semiconductor substrate having: a contact region; a select gate region; and a memory cell region; a first element isolation region formed in the contact region and having a first depth; a second element isolation region formed in the select gate region and having a second depth; and a third element isolation region formed in the memory cell region and having a third depth which is smaller than the first depth.

According to another aspect of the present invention, there is provided a semiconductor memory device including: a semiconductor substrate having: a contact region; a select gate region; and a memory cell region; a first element isolation region formed in the contact region and having a first average depth; a second element isolation region formed in the select gate region; and a third element isolation region formed in the memory cell region and having a second average depth which is smaller than the first average depth.

According to still another aspect of the present invention, there is provided a semiconductor memory device including: a semiconductor substrate having: an SOI region having a buried insulating film; and a bulk region; a contact region formed in the SOI region; a select gate region formed in the bulk region; a memory cell region formed in the SOI region; a first element isolation region formed in the contact region to reach the buried insulating film; a second element isolation region formed in the select gate region; and a third element isolation region formed in the memory cell region to reach the buried insulating film.

DETAILED DESCRIPTION OF THE INVENTION

Hereinafter, embodiments of the invention will be described with reference to the drawings. As a semiconductor device according to the embodiments, an NAND flash memory is described by way of example. In the embodiments, the same reference numerals and signs are given to the same constituent elements, and the overlapping description in the embodiments is omitted.

First Embodiment

According to a first embodiment of the invention, a memory cell portion in an NAND flash memory includes a contact region, a select gate region, and a memory cell region. In the memory cell portion, STI that isolates cells from each other is formed. An STI depth in the memory cell region is adjusted to be smaller than an STI depth in the contact region and the select gate region, thereby improving reliability in electrical characteristic of the memory cell region and reducing non-uniformity in characteristic as a product.

Figure 1:
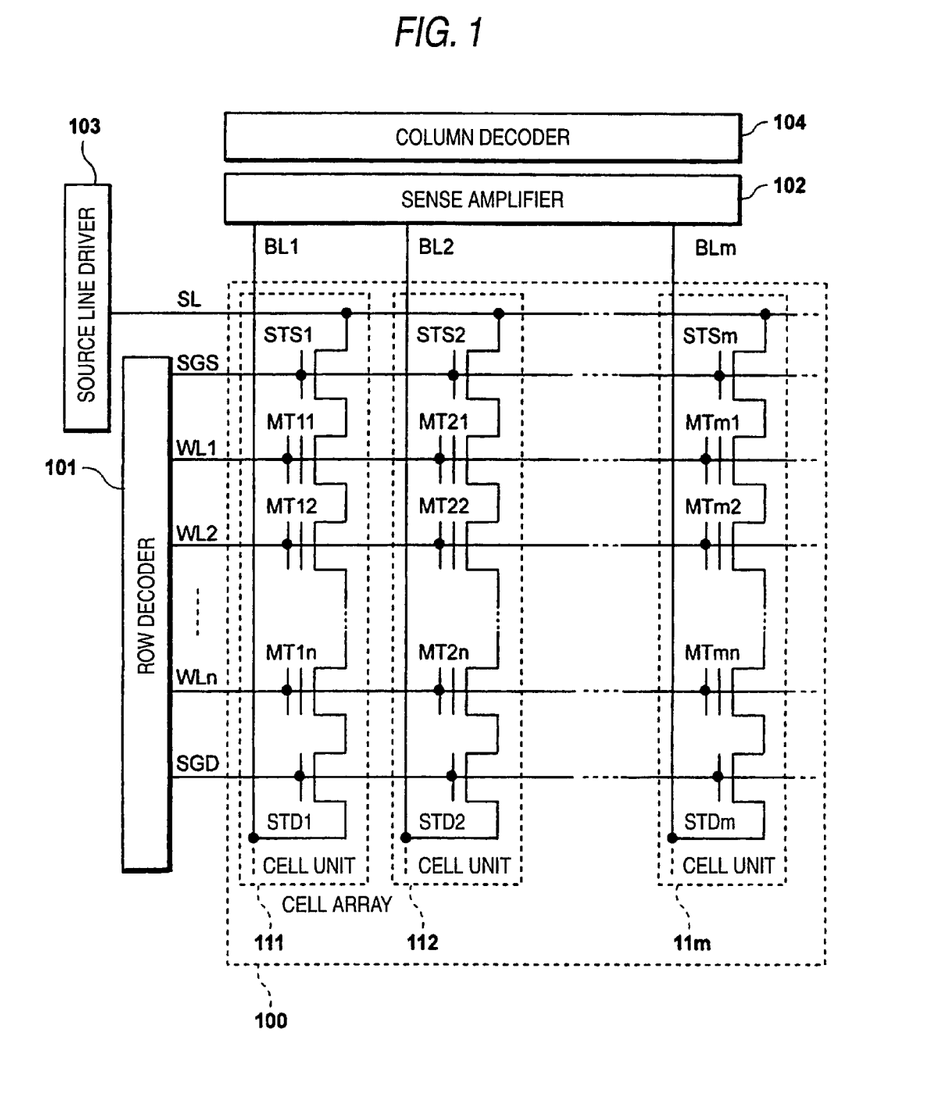
FIG. 1 is a diagram illustrating an exemplary equivalent circuit of an NAND flash memory.

As shown in FIG. 1, in the NAND flash memory, a cell array 100 includes, for example, m×n (m and n are integers) numbers of memory cell transistors MT11 to MT1n, MT21 to MT2n, ..., MTm1 to MTmn. In the cell array 100, a plurality of memory cell transistors MT11 to MT1n, MT21 to MT2n, ..., MTm1 to MTmn are arranged as a group in a column direction, and the plurality of memory cell transistors MT11 to MT1n, MT21 to MT2n, ..., MTm1 to MTmn are arranged as a group in a row direction, thereby arranging the plurality of cell transistors MT11 to MT1n, MT21 to MT2n, ..., MTm1 to MTmn in matrix.

The memory cell transistors MT11 to MT1n and first and second select gate transistors STS1 and STD1 are connected to each other in series to form a cell unit 111. The first and second select gate transistors STS1 and STD1 are provided for selecting the memory cell transistor MT11 to MT1n. A source terminal of the memory cell transistor MT11 is connected to a drain terminal of the first select gate transistor STS1. A drain terminal of the memory cell transistor MT1n is connected to a source terminal of the second select gate transistor STD1. The first select gate transistors STS2 to STSm, the memory cell transistors MT21 to MT2n, ... MTm1 to MTmn, and the second select gate transistors STD2 to STDm are connected to each other in series to form cell units 112, ..., 11m.

Source terminals of the first select gate transistors STS1 to STSm are commonly connected to a common source line SL. The common source line SL is connected to a source line driver 103 that supplies voltage to the common source line SL. Gate terminals of the first select gate transistors STS1 to STSm are commonly connected to a select gate line SGS. The select gate line SGS is connected to a row decoder 101. Gate terminals of the second select gate transistors STD1 to STDm are commonly connected to a select gate line SGD. The select gate line SGD is connected to the row decoder 101. Gate terminals of the memory cell transistors MT11, MT21, ..., MTm1 are commonly connected to a word line WL1. Gate terminals of the memory cell transistors MT12, MT22, ..., MTm2, MT1n, MT2n, ..., MTmn are commonly connected to word lines WL2 to WLn, respectively. The word lines WL1 to WLn are connected to the row decoder 101. Drain terminals of the second select gate transistors STD1 to STDm are connected to bit lines BL1 to BLm.

The row decoder 101 decodes row address signals, and selectively supplies the decoded row address signals to the word lines WL1 to WLn and the select gate lines SGS and SGD. A column decoder 104 decodes column address signals to obtain the decoded column address signals, and selects any one of the bit lines BL1 to BLm based on the decoded column address signals. A sense amplifier 102 amplifies a memory signal read out from the memory cell transistor selected by the row decoder 101 and the column decoder 104.

Figure 2:
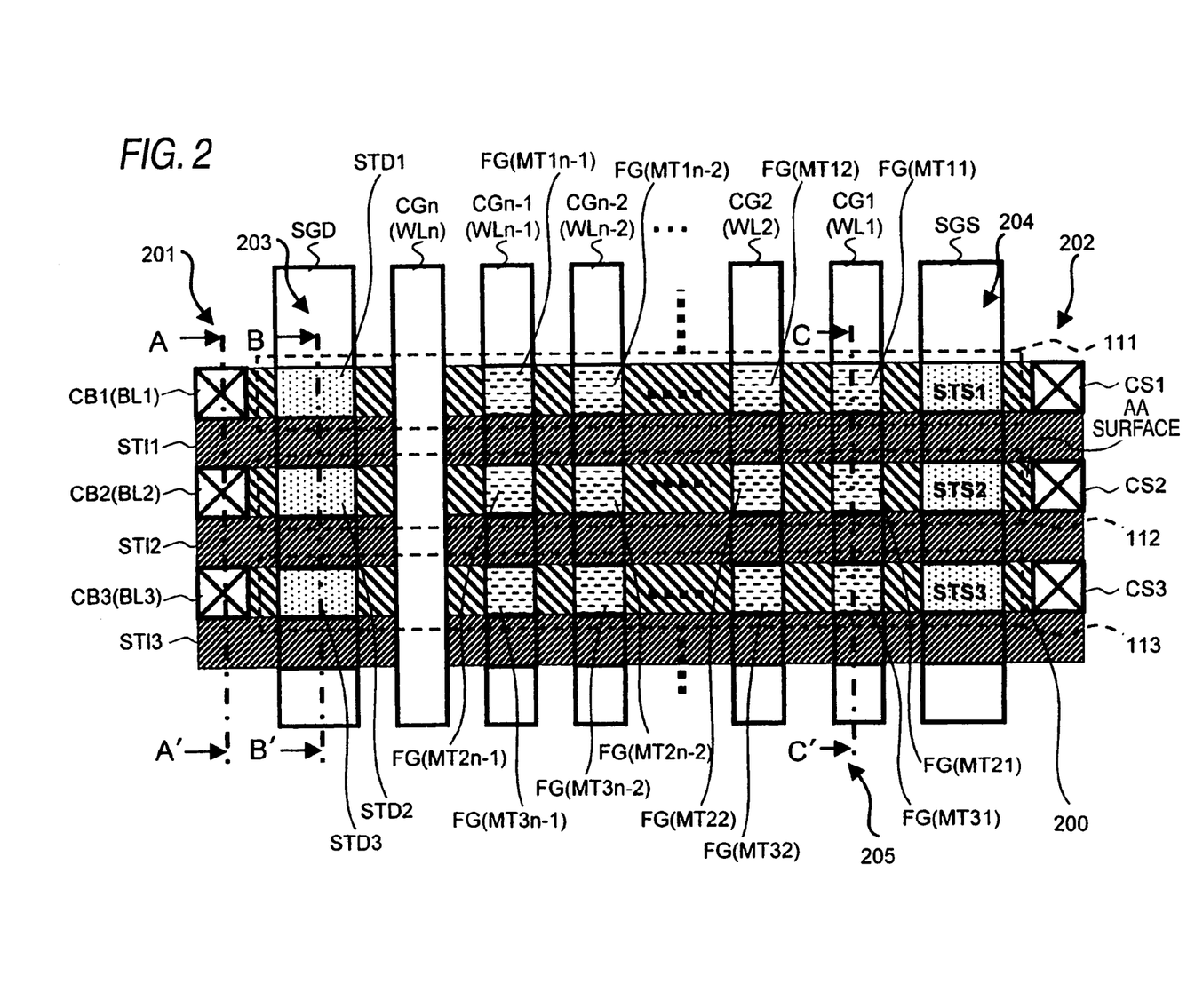
FIG. 2 is a plan view illustrating a structure of a cell array shown in FIG. 1.
Figure 3A:
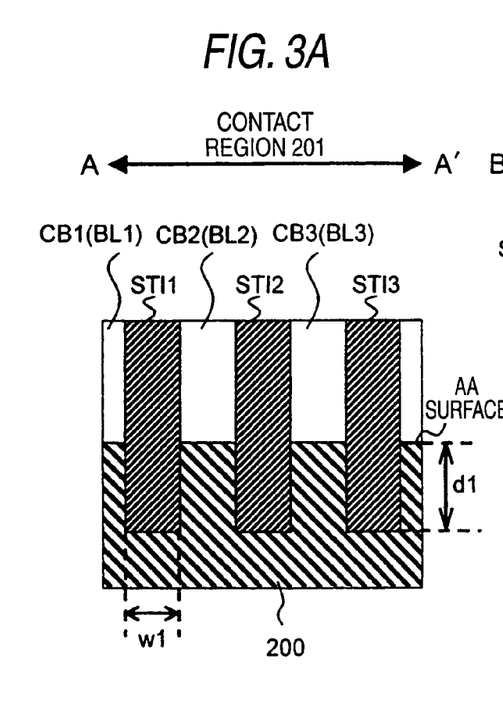
FIG. 3A is a sectional view taken along Line A-A' shown in FIG. 2 as viewed in a direction indicated by arrows.
Figure 3B:
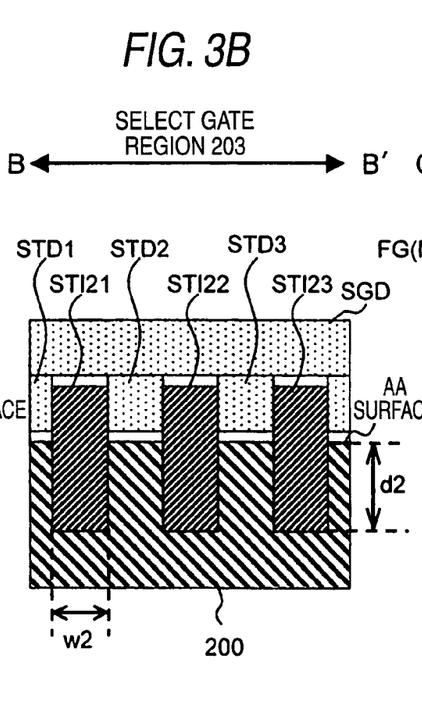
FIG. 3B is a sectional view taken along Line B-B' shown in FIG. 2 as viewed in a direction indicated by arrows.
Figure 3C:
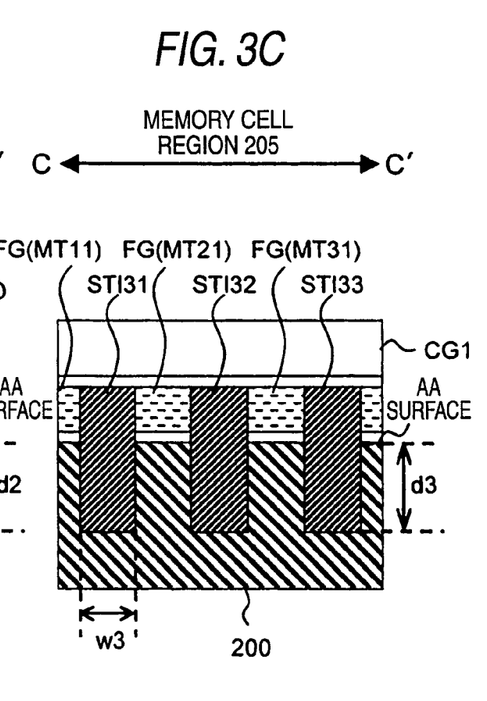
FIG. 3C is a sectional view taken along Line C-C' shown in FIG. 2 as viewed in a direction indicated by arrows.

A structure of the NAND flash memory corresponding to the cell array 100 of the equivalent circuit shown in FIG. 1 will be described with reference to FIG. 2 and FIGS. 3A to 3C. FIG. 2 is not a view illustrating the whole structure of the cell array 100, but is a view illustrating parts corresponding to the cell unit 111 to 113 connected to the bit lines BL1 to BL3 shown in FIG. 1. FIGS. 3A to 3C show that depths of element isolation regions STI formed in contact regions 201 and 202, a select gate region 203 and 204, and a memory cell region 205 are not adjusted. FIG. 1 shows that the word lines WL1 to WLn are arranged in the row direction and the bit lines BL1 to BLm are arranged in the column direction, but FIG. 2 shows that the bit lines BL1 to BL3 are arranged in the row direction, and the word lines WL1 to WLn and control gate lines CG1 to CGn are arranged in the column direction. The control gate lines CG1 to CGn are formed corresponding to the word lines WL1 to WLn, to supply control voltage to the word lines WL1 to WLn. In FIG. 2, the same reference numerals and signs are given to parts corresponding to the equivalent circuit shown in FIG. 1.

In FIG. 2, contact regions 201 and 202, select gate regions 203 and 204, memory cell region 205 are formed on a silicon substrate 200 in the cell array 100. The contact region 201 has bit line contacts CB1 to CB3 formed at the left ends of the bit lines BL1 to BL3 in FIG. 2. Although not shown in FIG. 2, bit line contacts CB4 to CBn are formed at the left ends of the other bit lines BL4 to BLn. FIG. 3A shows a sectional view taken along Line B-B' of the contact region 201 as viewed in a direction indicated by arrows. As shown in FIG. 2 and FIG. 3A, STI1 to STI3 (first element isolation region) for isolating the bit line contacts CB1 to CB3 are formed in the contact region 201. The STI1 to STI3 have a width w1 (first width), and a depth d1 (first depth). In this case, the depth d1 is a distance from the surface (AA surface) of the silicon substrate 200 shown in FIG. 3A to the bottom of the STI1 to STI3. The contact region 202 has source line contacts CS1 to CS3 formed at the right ends in FIG. 2. The source line contacts CS1 to CS3 is formed to connect the source terminals of the first select gate transistors STS1 to STS3 in the cell units 111 to 113 to the common source line SL shown in FIG. 1, respectively. Although not shown in FIG. 2, source line contacts CS4 to CSm corresponding to the other first select gate transistors STS4 to STSm are formed at the right ends. Although not shown, the contact region 202 including the source line contacts CS1 to CS3 formed at the right ends in FIG. 2 has the same sectional structure as the contact region 201 shown in FIG. 3A.

The select gate lines SGD and SGS extending in the column direction at both of the left and right ends of the cell units 111 to 113 in FIG. 2 are formed in the select gate region 203 and 204. Although not shown in FIG. 2, the select gate lines SGD and SGS extending in the column direction are formed at both of the left and right ends in the other cell units 114 to 11m. FIG. 3B shows a sectional view taken along Line B-B' of the select gate region 203 of the select gate regions 203 and 204 as viewed in a direction indicated by arrows. As shown in FIG. 3B, STI21 to STI23 (second element isolation region) for isolating the first select gate transistors STD1 to STD3 formed at an interval in the column direction in FIG. 2 are formed below the select gate line SGD. Although not shown the select gate region 204 shown in FIG. 2 has the same sectional structure. The STI21 to STI 23 have a width w2 (second width) and a depth d2 (second depth). In this case, the depth d2 is a distance from the surface (AA surface) of the silicon substrate 200 shown in FIG. 3B to the bottom of the STI 21 to STI 23.

The control gate line CG1 connected to the memory cell transistors MT11, MT21, and MT31 in the cell units 111 to 113 shown in FIG. 1 is formed in the memory cell region 205 to extend in the column direction. As shown in FIG. 2, the control gate lines CG2 to CGn connected to the memory cell transistors MT12 to MT1n, MT22 to MT2n, and MT32 to MT3n in the cell units 111 to 113 are formed in the column direction at an interval. FIG. 3C shows a sectional view taken along Line C-C' of the memory cell region 205 as viewed in a direction indicated by arrows. As shown in FIG. 3C, STI31 to STI33 (third element isolation region) for isolating floating gates FG of the memory cell transistors MT11, MT21, and MT31 are formed below the control gate line CG1. Although not shown, the memory cell transistors MT12 to MT1n, MT22 to MT2n, and MT32 to MT3n have the same sectional structure as FIG. 3C. The STI31 to STI33 have a width w3 (third width) and a depth d3 (third depth). In this case, the depth d3 is a distance from the surface (AA surface) of the silicon substrate 200 shown in FIG. 3C to the bottom of the STI31 to STI33.

In the semiconductor memory device, such as the NAND flash memory having the memory cell structure exemplified in FIG. 2 and FIGS. 3A to 3C, an element pattern is miniaturized as a high integration progresses. In the contact region 201, the select gate region 203, or the memory cell region 205 shown in FIGS. 3A to 3C, an interval between elements such as the bit line BL and the word line WL are getting smaller. In the STI1 to STI3, the STI21 to STI23, and STI31 to STI33 formed in the regions 201, 203, and 205 as shown in FIGS. 3A to 3C, an aspect ratio of the STI is increased by the smaller interval between the elements. Accordingly, it may be difficult to bury an insulating film in the STI. For this reason, for example, in the NAND flash memory, when a back gate bias control in which bias voltage is applied from the silicon substrate is performed, it is difficult to apply the bias voltage to the surface (AA surface of silicon substrate 200 shown at the right end in FIG. 2) of an active area (AA) and thus it is difficult to perform a data erase operation or the like. To improve such a situation, it is effective to adjust the depth of the STI31 to STI33 in the memory cell region 205 smaller than the depth of the STI1 to STI3 and the STI21 to STI23 in the contact region 201 and the select gate region 203. The depths d1, d2, and d3 of the STI1 to STI3, STI21 to STI23, and STI31 to STI 33 in the contact region 201, the select gate region 203, and the memory cell region 205 shown in FIGS. 3A to 3C are the same.

Figure 4:
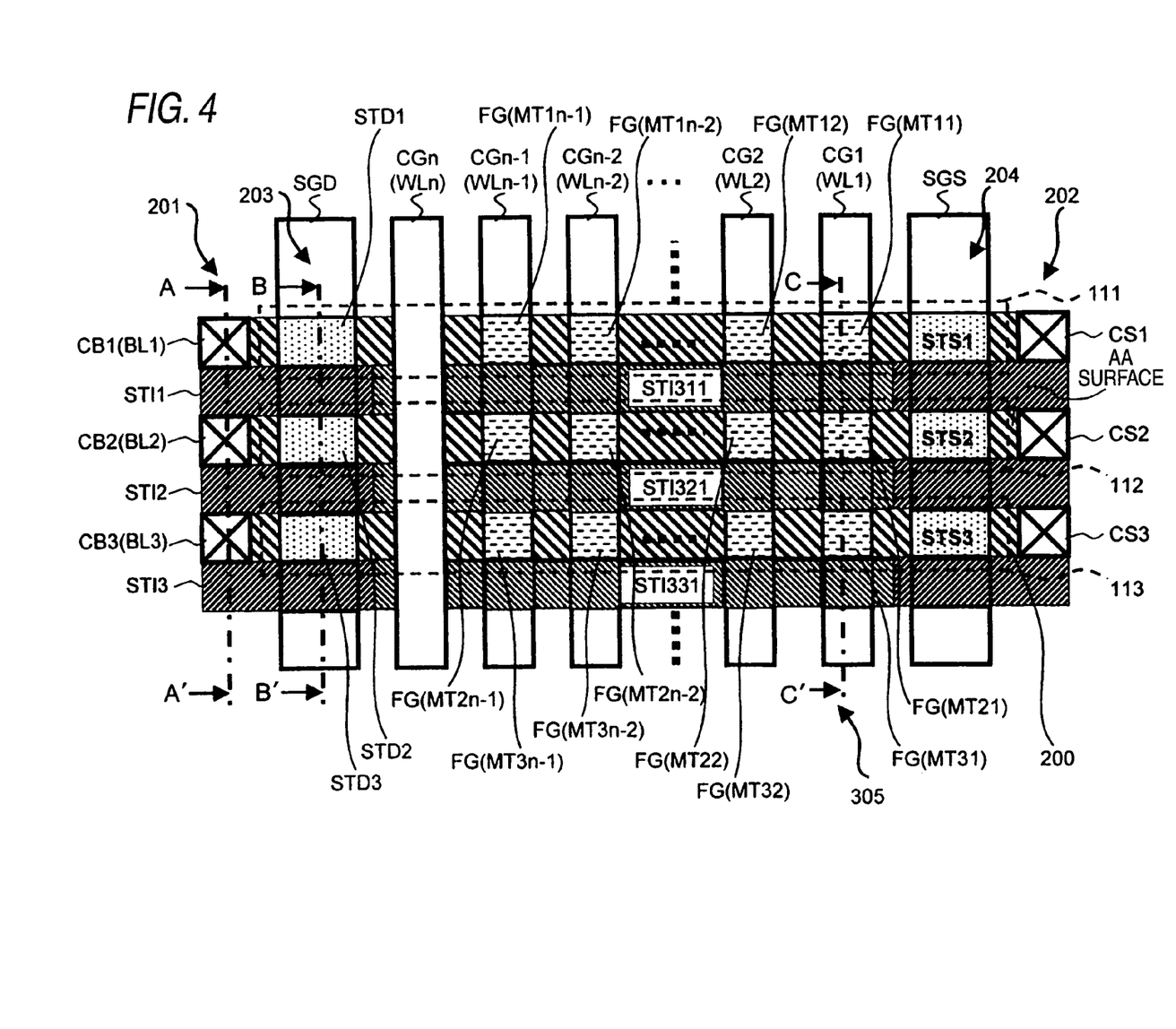
FIG. 4 is a plan view illustrating a structure of a cell array according to a first embodiment of the present invention.
Figure 5A:
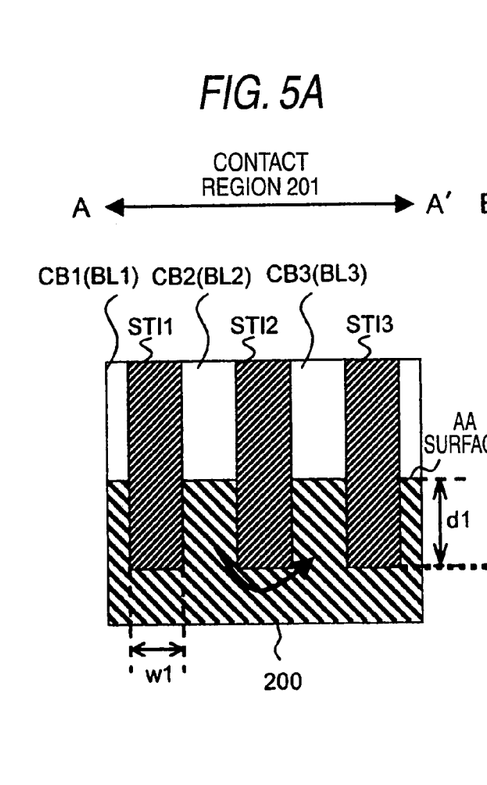
FIG. 5A is a sectional view taken along Line A-A' shown in FIG. 4 as viewed in a direction indicated by arrows.
Figure 5B:
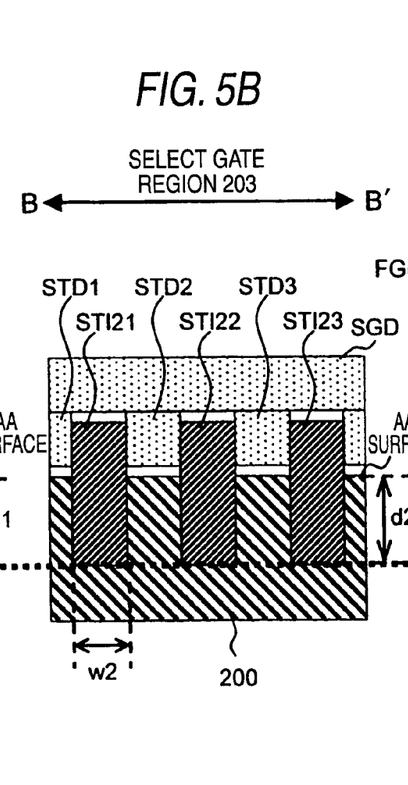
FIG. 5B is a sectional view taken along Line B-B' shown in FIG. 4 as viewed in a direction indicated by arrows.
Figure 5C:
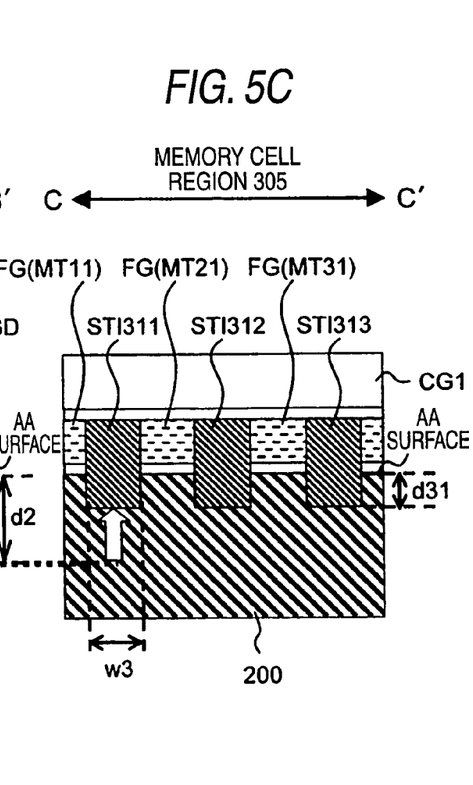
FIG. 5C is a sectional view taken along Line C-C' shown in FIG. 4 as viewed in a direction indicated by arrows, according to the first embodiment.

Hereinafter, a structure that the depth of the STI31 to STI33 in the memory cell region 205 is formed small will be described with reference to FIG. 4 and FIGS. 5A to 5C. FIG. 4 is a plan view illustrating a structure of the cell array 100. FIGS. 5A to 5C are sectional views taken along Line A-A', Line B-B', and Line C-C' shown in FIG. 4 as viewed in a direction indicated by arrows.

As shown in FIG. 4 and FIG. 5C, STI311 to STI313 having a depth d31 smaller than the depth d1 and d2 of STI1 to STI3 and STI21 to STI23 formed in the contract region 201 and the select gate region 203 shown in FIGS. 5A and 5B are formed in a memory cell region 305. The depth d31 is a distance from the surface (AA surface) of the silicon substrate 200 shown in FIG. 5C to the bottom of the STI311 to STI313. In this case, the depths d1 and d2 and the depth d31 are in relation of d1, d2>d31. It is necessary that the STI21 to STI23 and the STI1 to STI3 are formed to have depths securing an enough punch-through resistance. Although, in the contact region 201, impurity concentration of a diffusion layer in the silicon substrate 200 is set to permit junction leak, it is necessary to set the depth of the STI enough to secure punch-through resistance between the contacts of the bit line contacts CB1 to CB3 and the source line contacts CS1 to CS3. Also in the contact region 202, the depth of the STI1 to STI3 needs to be set to secure the punch-through resistance. Thus, in the first embodiment, the depth d1 of the STI1 to STI3 in the contact regions 201 and 202 is set larger than the depth d31 of the STI311 to STI313 in the memory cell region 305. Although not shown, the memory cell transistors MT12 to MT1n, MT22 to MT2n, and MT32 to MT3n have the same sectional structure as FIG. 5C.

To lower contact resistance, for example, a diffusion layer in which impurities are heavily diffused is formed in a silicon substrate coming into contact with a contact region by ion implantation with high dose. However, in the case of forming the diffusion layer by ion implantation, the diffusion layer gets deeper by diffusion of impurities in an activation annealing process after the ion implantation, thereby interfering with miniaturization. To lower the junction leak of the diffusion layer, it is necessary to lower an impurity concentration around the junction part. However, when the impurity concentration is lowered too much, punch-through resistance may be decreased between the adjacent contact regions. For this reason, it is necessary to appropriately set the depth of each STI in the select gate region and the contact region. That is, it is necessary to set the depth of each STI in the select gate region and the contact region in consideration of the junction leak of a diffusion layer and the punch-through resistance between contacts.

In the memory cell region 305, the depth d31 of the STI311 to STI313 may be set to prevent leak current between adjacent memory cell transistors (adjacent bit lines BL) at the time of writing.

As described above, in the cell array 100 of the NAND flash memory according to the first embodiment, the depth d31 of the STI311 to STI313 in the memory cell region 305 is formed smaller than the depths d1 and d2 of the STI1 to STI3 and STI21 to STI23 formed in the contact region 201 and the select gate region 203. For this reason, it is easy to bury the insulating films of the STI311 to STI313 in the memory cell region 305, and thus it is possible to produce the cell array 100 with high reliability. In addition, since the depth d31 of the STI311 to STI313 in the memory cell region 305 is formed small, a control property in a channel region of a memory transistor is improved. Therefore, it is possible to realize the NAND flash memory having a good erase property and coping with high integration Second Embodiment According to a second embodiment of the invention, in the cell array 100 of the NAND flash memory according to the first embodiment, the depth of each STI in the select gate region and the memory cell region is formed smaller than the depth of the STI in the contact region.

A structure of the memory cell portion in which the depths of STI411 to STI413 in the select gate region 403 and the memory cell region 305 are formed small will be described with reference to FIG. 6 and FIGS. 7A to 7C.

Figure 6:
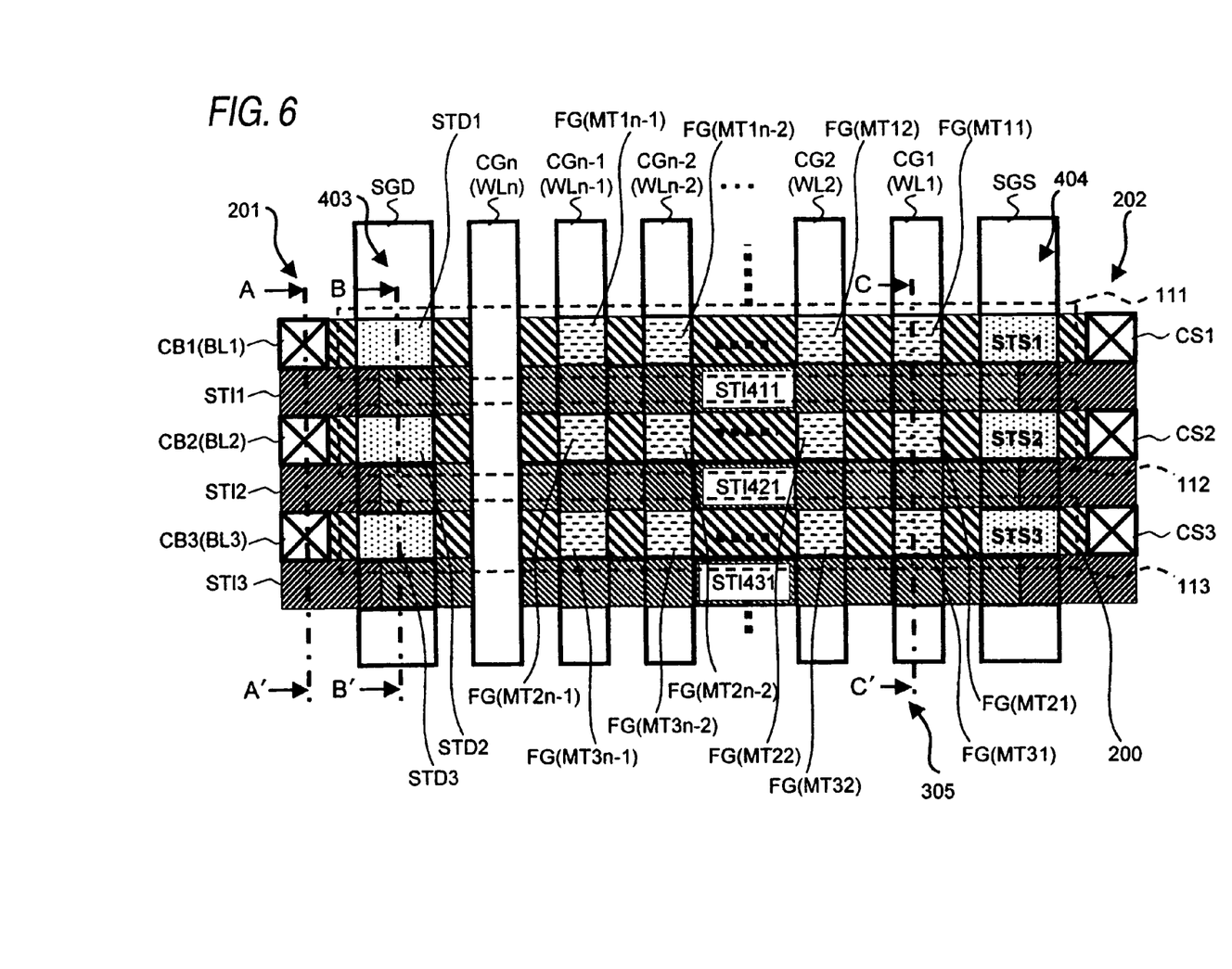
FIG. 6 is a plan view illustrating a structure of a cell array in an NAND flash memory according to a second embodiment of the invention.
Figure 7A:
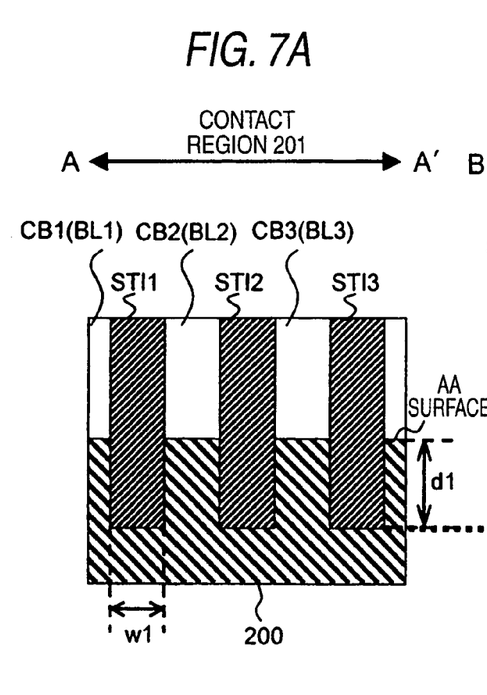
FIG. 7A is a sectional view taken along Line A-A' shown in FIG. 6 as viewed in a direction indicated by arrows.
Figures 7B, 7C:
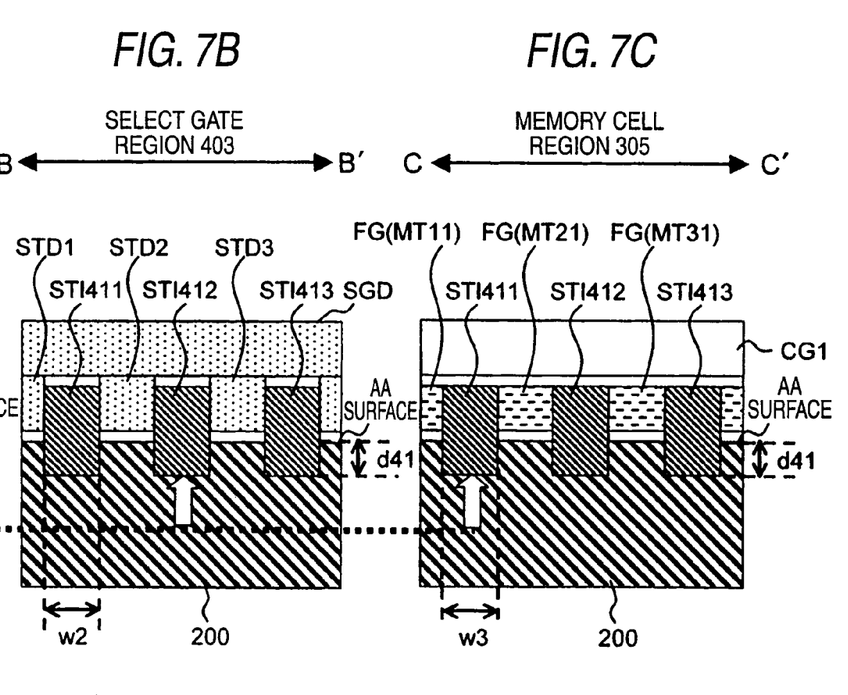
FIG. 7B is a sectional view taken along Line B-B' shown in FIG. 6 as viewed in a direction indicated by arrows.
FIG. 7C is a sectional view taken along Line C-C' shown in FIG. 6 as viewed in a direction indicated by arrows, according to the second embodiment.

In FIG. 6 and FIGS. 7B and 7C, STI411 to STI413 having a depth d41 smaller than the depth d1 of the STI1 to STI3 formed in the contact region 201 shown in FIG. 7A are formed in the select gate region 403 and the memory cell region 305. The depth d41 is a distance from the surface (AA surface) of the silicon substrate 200 shown in FIG. 7C to the bottom of the STI411 to STI413. In this case, the depth d1 and the depth d41 are in relation of d1>d41. As described above, to secure the punch-through resistance, it is necessary to maintain the depth of the STI1 to STI3 in the contact region 201. For this reason, in the second embodiment, the depth d1 of the STI1 to STI3 in the contact region 201 is formed larger than the depth d41 of the STI411 to STI413 in the select gate region 403 and the memory cell region 305, so that the contact region 201 is isolated by the STI1 to STI3 having the larger depth. Although not shown, the select gate region 404 having the first select gate transistors STS1 to STS3 formed at the right end in FIG. 6 has the same sectional structure as FIG. 7B.

In the contact region 201, the common bias is applied to the contact region 202. When there is no problem of leak among the source line contact CS1 to CS3, only the depth of the STI1 to STI3 in the contact region 201 close to the bit line contacts CB1 to CB3 may be set larger.

As described above, in the cell array 100 of the NAND flash memory according to the second embodiment, the depth d41 of the STI411 to STI413 in the select gate region 403 and the memory cell region 305 is formed smaller than the d1 of the STI1 to STI3 in the contact region 201. For this reason, it is easy to bury the insulating films of the STI411 to STI413 in the select gate region 403 and the memory cell region 305, and thus it is possible to produce the cell array 100 with high reliability. In addition, since the depth of the STI411 to STI413 in the memory cell region 305 is formed small, a control property in a channel region of a memory transistor is improved. Therefore, it is possible to realize the NAND flash memory having a good erase property and coping with high integration.

Third Embodiment

According to a third embodiment of the invention, in the cell array 100 of the NAND flash memory according to the first embodiment, the memory cell region is formed on an SOI (Silicon on Insulator), and the depth of the STI in the memory cell region is formed smaller than the depth of the STI in the contact region and the select gate region.

A structure of the cell array 100 in which the depth of the STI in the memory cell region is formed small will be described with reference to FIG. 8 and FIGS. 9A to 9C.

Figure 8:
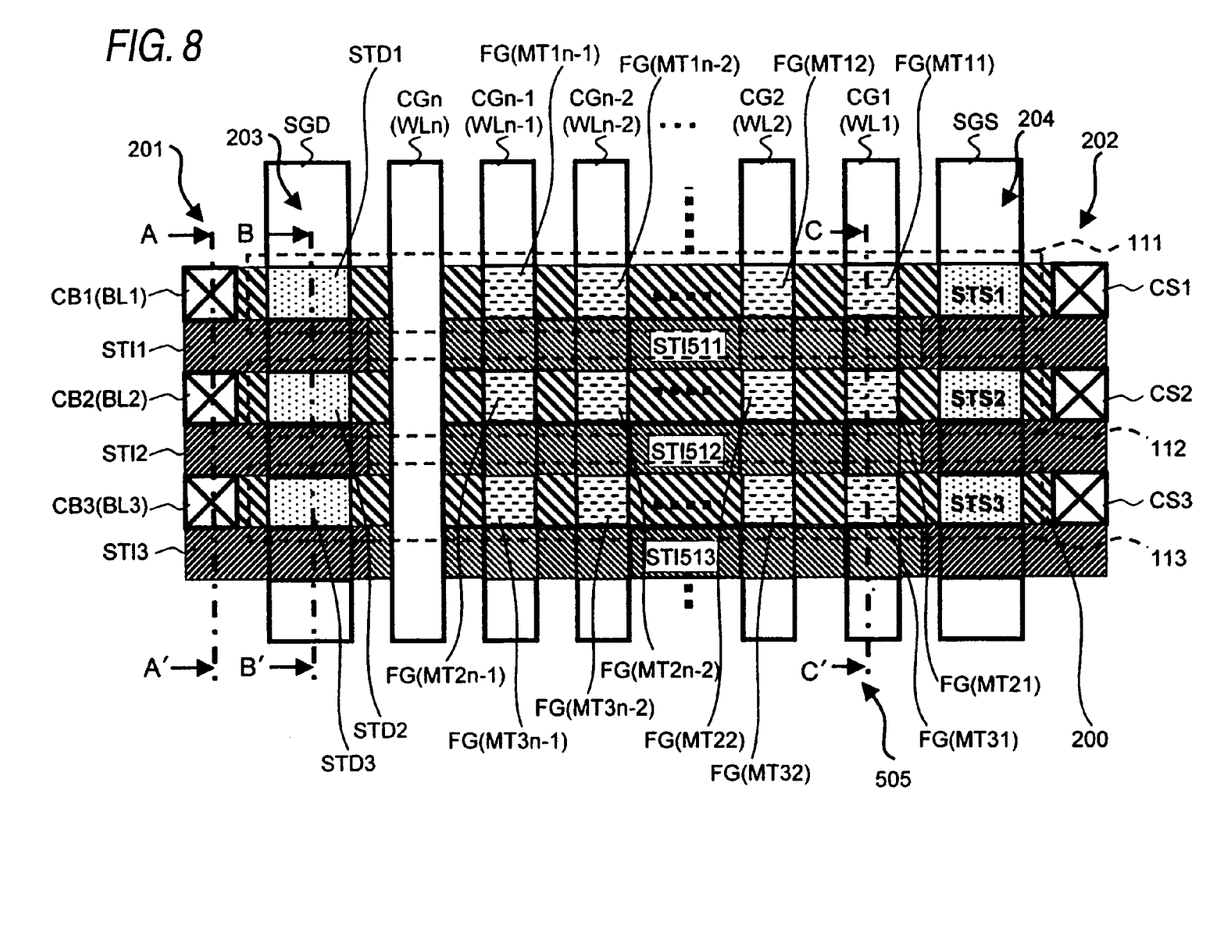
FIG. 8 is a plan view illustrating a structure of a cell array in an NAND flash memory according to a third embodiment of the invention.
Figure 9A:
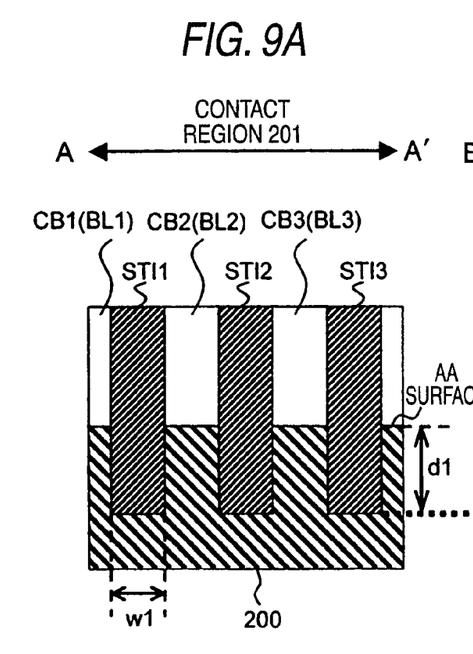
FIG. 9A is a sectional view taken along Line A-A' shown in FIG. 8 as viewed in a direction indicated by arrows.
Figure 9B:
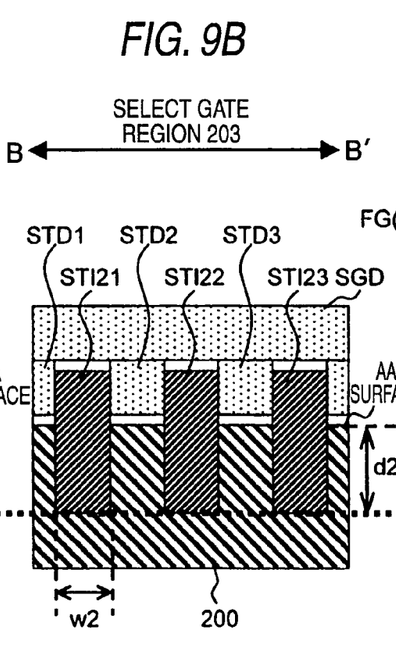
FIG. 9B is a sectional view taken along Line B-B' shown in FIG. 8 as viewed in a direction indicated by arrows.
Figure 9C:
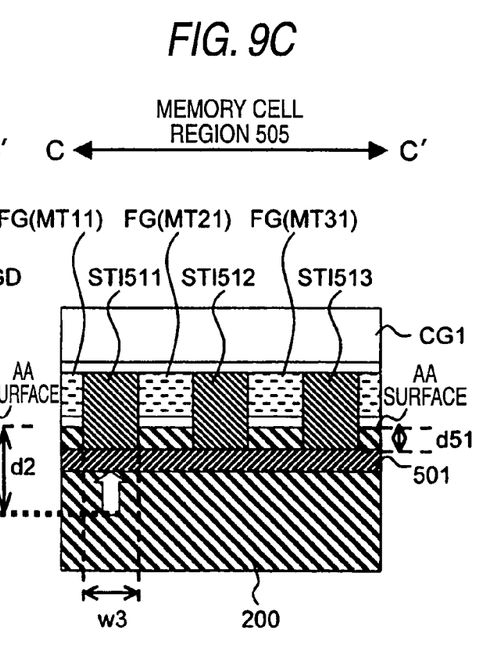
FIG. 9C is a sectional view taken along Line C-C' shown in FIG. 8 as viewed in a direction indicated by arrows, according to the third embodiment.

In FIG. 8 and FIG. 9C, STI511 to STI 513 having a depth d51 smaller than the depths d1 and d2 in the STI1 to STI3 and the STI21 to STI23 in the contact region 201 and the select gate region 203 shown in FIGS. 9A and 9B are formed in the memory cell region 505. The depth d51 is a distance from the surface (AA surface) of the silicon substrate 200 shown in FIG. 9C to the bottom (surface of SOI insulating film 501) of the STI511 to STI513. In this case, the depths d1 and d2 and the depth d51 are in relation of d1, d2>d51. As shown in FIG. 9C, the memory cell region 505 is formed on an SOI insulating film 501. As shown in FIGS. 9A and 9B, the contact region 201 and the select gate region 203 are formed on the silicon substrate 200. In this case, it is possible to separately form the depth of the STI in the other region. In this case, the STI reaching a buried oxide film (BOX) may be formed to electrically isolate memory cells from each other.

On a region (hereinafter, this region is referred to as a bulk 200) in the silicon substrate 200 where the BOX is not formed, for example, the STI depth is set so that the leak between contacts is prevented.

As described above, in the cell array 100 of the NAND flash memory according to the third embodiment, the depth d51 of the STI511 to STI513 in the memory cell region 505 formed on the SOI insulating film 501 is formed smaller than the depths d1 and d2 of the STI1 to STI3 and STI21 to STI23 in the contact region 201 and the select gate region 203. For this reason, it is easy to bury the insulating film of the STI511 to STI513 in the memory cell region 505, and thus it is possible to produce the cell array 100 with high reliability. In addition, since the depth d51 of the STI511 to STI513 in the memory cell region 505 is formed small, a control property in a channel region of a memory transistor is improved. Therefore, it is possible to realize the NAND flash memory having a good erase property and coping with high integration.

Fourth Embodiment

According to a fourth embodiment of the invention, in the cell array 100 of the NAND flash memory according to the first embodiment, the contact region and the memory cell region are formed on the SOI, and the depth of the STI in the contact region and the memory cell region is formed smaller than the depth of the STI in the select gate region.

A structure of the memory cell portion in which the depth of the STI in the contact region and the memory cell region is formed small will be described with reference to FIG. 10 and FIGS. 11A to 11C.

Figure 10:
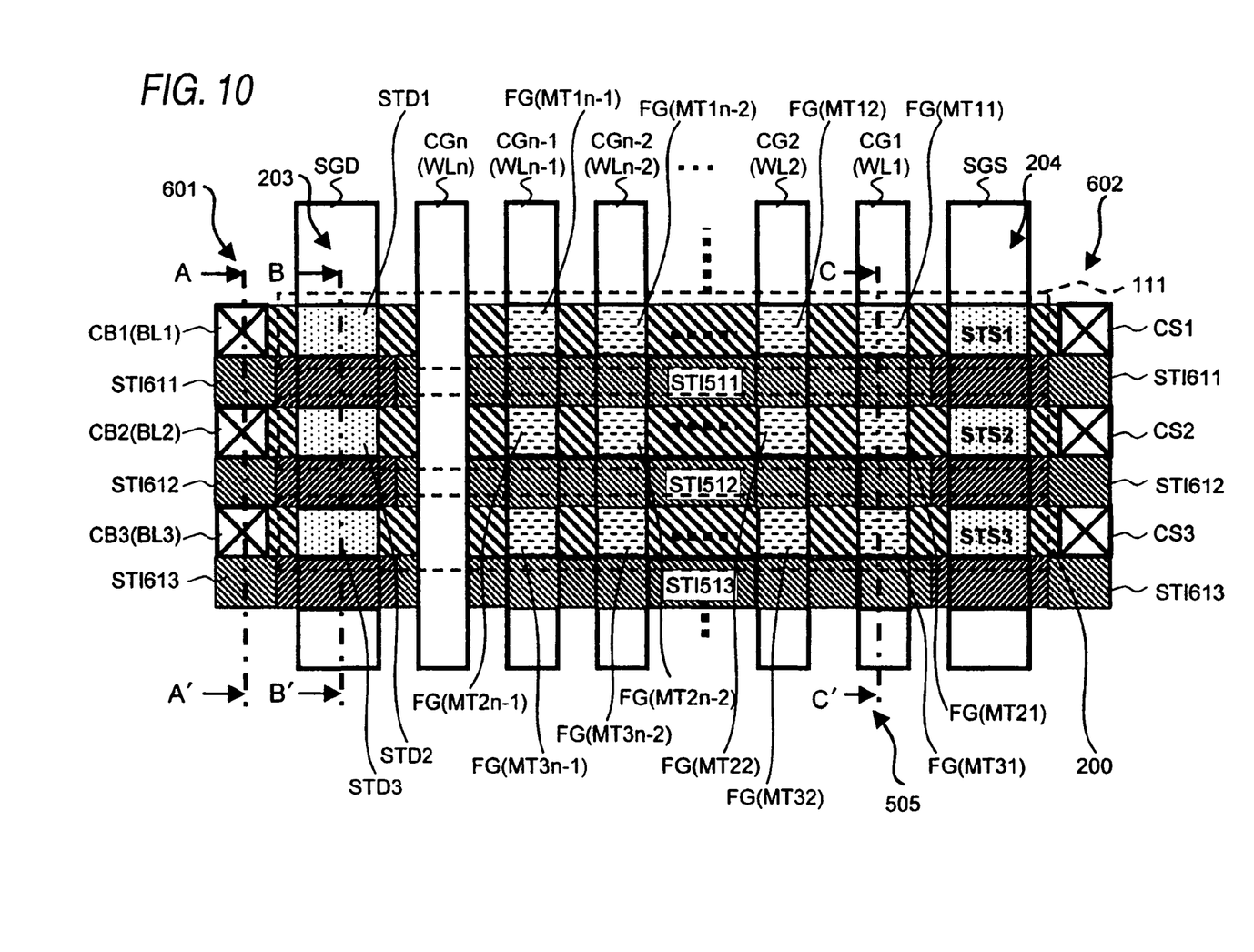
FIG. 10 is a plan view illustrating a structure of a cell array in an NAND flash memory according to a fourth embodiment of the invention.
Figure 11A:
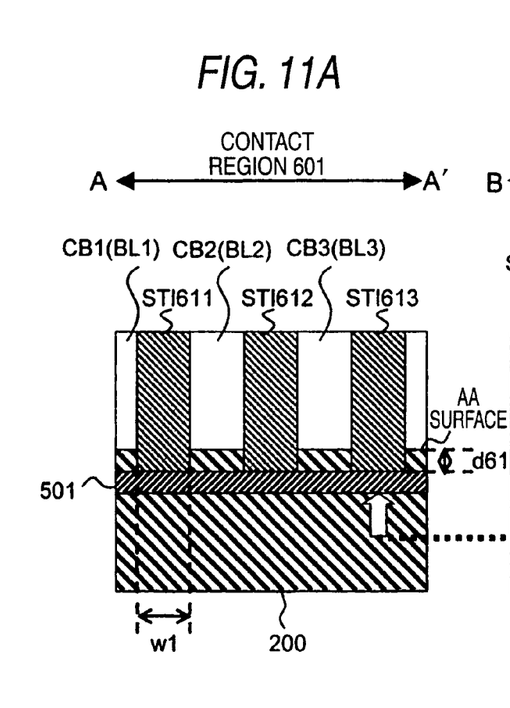
FIG. 11A is a sectional view taken along Line A-A' shown in FIG. 10 as viewed in a direction indicated by arrows.
Figures 11B, 11C:
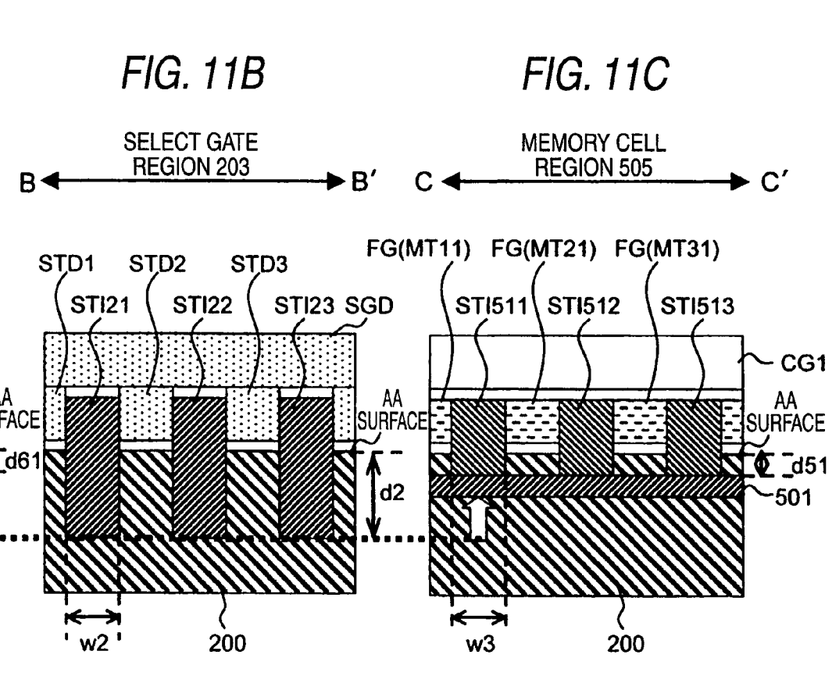
FIG. 11B is a sectional view taken along Line B-B' shown in FIG. 10 as viewed in a direction indicated by arrows.
FIG. 11C is a sectional view taken along Line C-C' shown in FIG. 10 as viewed in a direction indicated by arrows, according to the fourth embodiment.

In FIG. 10 and FIGS. 11A and 11C, STI511 to STI513 and STI611 to STI613 having depths d51 and d61 smaller than the depth d2 of the STI21 to STI23 formed in the select gate region 203 shown in FIG. 11B are formed in the contact region 601 and the memory cell region 505, respectively. The depths d51 and d61 are distances from the surface (AA surface) of the silicon substrate 200 shown in FIGS. 11A and 11C to the bottom (surface SOI insulating film 501) of the STI611 to STI613 and the STI511 to STI513, respectively. In this case, the depth d2 and the depths d51 and d61 are in relation of d2>d51, d61. In this case, the STI511 to STI513 and the STI611 and STI613 reaching to the buried oxide film BOX may be formed to isolate memory cells from each other in the contact region 601 and the memory cell region 505 formed on the SOI insulating film 501. Although not shown, the contact region 602 having the source line contacts CS1 to CS3 formed at the right end in FIG. 10 has the same sectional structure as FIG. 11A.

In the select gate region 203 formed on the bulk 200 having no BOX, the depth d2 of the STI21 to STI23 may be set to prevent leak between the select gate lines adjacent to each other. In the fourth embodiment, the memory cell region 505 and the contact region 601 are formed on the SOI insulating film 501. However, when a part of the memory cell region 505 is formed on the bulk 200, the depth of the STI in the memory cell region formed on the bulk 200 may be set larger than the depth d51 of the STI511 to STI513 in the memory cell region 505 formed on the SOI insulating film 501. The depth d51 of the STI511 to STI513 in the memory cell region 505 formed on the SOI insulating film 501 and the depth of the memory cell region formed on the bulk 200 as described above, may be determined to satisfy the electrical characteristic conditions such as leak between memory cells.

As described above, in the cell array 100 of the NAND flash memory according to the fourth embodiment, the depths d51 and d61 of the STI511 to STI513 and the STI611 to STI613 in the contact region 601 and the memory cell region 505 formed on the SOI insulating film 501 are formed smaller than the depth d2 of the STI21 to STI23 in the select gate region 203. For this reason, it is easy to bury the insulating films of the STI511 to STI513 and the STI611 to STI613 in the contact region 601 and the memory cell region 505, and thus it is possible to produce the cell array 100 with high reliability. In addition, since the depth d51 of the STI511 to STI513 in the memory cell region 505 is formed small, a control property in a channel region of a memory transistor is improved. Therefore, it is possible to realize the NAND flash memory having a good erase property and coping with high integration.

A method for producing the STI in the memory cell portion according to the first to fourth embodiments will be described.

[Method for Producing STI on Bulk 200]

When the STI is formed on the bulk 200, RIE (Reactive Ion Etching) performed twice. First, an oxide film is grown on the bulk 200, and then a resistor pattern is formed in a region that becomes the STI. Then, ion implantation is performed using the resistor pattern as a mask to form a diffusion layer. Then, the diffusion layer is etched by the first RIE to form STI311 to STI313 and STI411 to STI413 shallowly. Then, the shallow STI is masked, and STI1 to STI3 and STI21 to STI23 are formed deeply by the second RIE. The RIE is performed twice as described above, thereby forming the shallow STI311 to STI313 and STI411 to STI413 in the memory cell region 305, or the memory cell region 305 and select gate region 403, and forming the deep STI1 to STI3 and STI21 and STI23 in the contact region 201 and the select gate region 203, or the contact region 201, as described in the first embodiment and the second embodiment.

[Method for Producing STI on Partial SOI]

In RIE for forming STI on SOI, an etching depth in the SOI region is set small by adjusting an etching condition so that a selectivity ratio between Si and $SiO_2$ becomes large. The etching condition is adjusted so that the selectivity ratio between the Si and $SiO_2$ becomes large to change the depths of the STI511 to STI513 and the STI611 to STI613 on the partial SOI, thereby forming the shallow STI511 to STI513 and STI611 to STI613 in the memory cell region 505, or the memory cell region 505 and the contact region 601, and forming the deep STI1 to STI3 and STI21 to STI23 in the contact region 201 and the select gate region 203, or the select gate region 203, as described in the third embodiment and the fourth embodiment.

Next, in the cell array 100 described in the first to fourth embodiment by way of example, distribution of depths of STI having a depth different for each of the contact region, the select gate region, and the memory cell region will be described with reference to FIG. 12.

Figure 12:
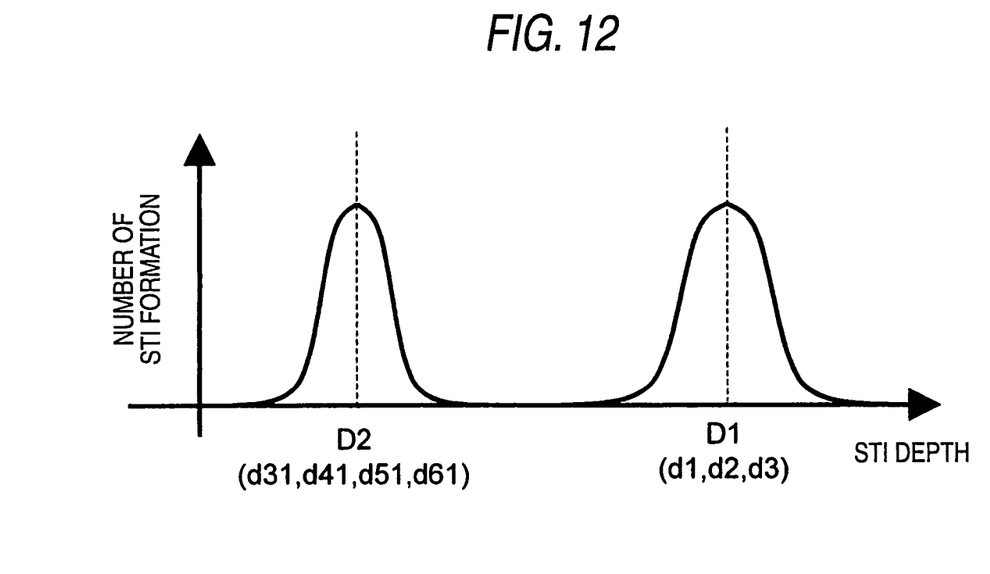
FIG. 12 is a diagram illustrating distribution of an STI depth according to the first to fourth embodiments.

In FIG. 12, a vertical axis denotes the number of the STI formation, and a horizontal axis denotes the STI depth. An average depth of the STI formed by the first RIE is D2, and an average depth of the STI formed by the second RIE is D1. The depths d31, d41, d51, and d61 correspond to the average depth D2, and the depths d1, d2, and d3 correspond to the average depth D1. The depth of the STI formed by the first RIE is normally distributed around D2, and the depth of the STI formed by the second RIE is normally distributed around D1. By performing both of the first and the second RIE so that the STI depths thereof are not overlap, STI can be formed to have respective depths according to the regions in the cell array 100 as described in the first to fourth embodiments. That is, the difference in the STI depths in the first to fourth embodiments can be provided independent of the variation.

While certain embodiments of the present inventions have been described, these embodiments have been presented by way of example only, and are not intended to limit the scope of the inventions. Various alternative embodiments will become apparent from this disclosure to those skilled in the art.

What is claimed is:

1. A semiconductor memory device comprising:
a semiconductor substrate having a memory area and a peripheral circuit area, said memory area including,
a contact region,
a select gate region, and
a memory cell region having plural memory strings each including memory cell transistors interconnected in a first direction, said contact region and said select gate region arranged in a second direction transverse to said first direction;
a first element isolation region formed in the contact region and having a first depth within a first distribution of depths;
a second element isolation region formed in the select gate region and having a second depth within a second distribution of depths; and
a third element isolation region formed in the memory cell region and having a third depth within a third distribution of depths, which is smaller than the first depth; wherein all depths are measured in a third direction normal to said first and second directions.

2. The semiconductor memory device according to claim 1, wherein the second depth is substantially same as the first depth.

3. The semiconductor memory device according to claim 1, wherein the second depth is substantially same as the third depth.

4. The semiconductor memory device according to claim 1, wherein the second depth is smaller than the first depth.

5. The semiconductor memory device according to claim 1, wherein the semiconductor substrate is an SOI substrate.

6. The semiconductor memory device according to claim 5, wherein the memory cell region is formed above a buried insulating film of the SOI substrate.

7. The semiconductor memory device according to claim 1, wherein the first distribution of depths of the first depth does not overlap the third distribution of depths of said third depth.

8. The semiconductor memory device according to claim 1, wherein the third depth is adjusted so that a bias voltage is supplied on an active region surface of the semiconductor substrate.

9. The semiconductor memory device according to claim 1, wherein the first depth is adjusted to ensure a punch-through resistance.

10. The semiconductor memory device according to claim 1, wherein the first depth corresponds to a height from a bottom of the first element isolation region to a top surface of the semiconductor substrate,
wherein the second depth corresponds to a height from a bottom of the second element isolation region to the top surface of the semiconductor substrate, and
wherein the third depth corresponds to a height from a bottom of the third element isolation region to the top surface of the semiconductor substrate.

11. The semiconductor memory device according to claim 1, wherein widths of the first to third element isolation regions along a longitudinal direction of a word line are substantially same.

12. A semiconductor memory device comprising:
a semiconductor substrate having a memory area and a peripheral circuit area, said memory area including,
a contact region,
a select gate region, and
a memory cell region having plural memory strings each including memory cell transistors interconnected in a first direction, said contact region and said select gate region arranged in a second direction transverse to said first direction;

a first element isolation region formed in the contact region and having a first average depth;

a second element isolation region formed in the select gate region; and a third element isolation region formed in the memory cell region and having a second average depth which is smaller than the first average depth; wherein all depths are measured in a third direction normal to said first and second directions.

13. The semiconductor memory device according to claim 12,
wherein the second element isolation region has the first average depth.

14. The semiconductor memory device according to claim 12,
wherein the second element isolation region has the second average depth.

15. The semiconductor memory device according to claim 12,
wherein widths of the first, second and third element isolation regions along a longitudinal direction of a word line are substantially same.

16. The semiconductor memory device according to claim 12,
wherein an average depth of the second element isolation region is equal to or larger than the second average depth.

17. The semiconductor memory device according to claim 12,
wherein an average depth of the second element isolation region is equal to or smaller than the first average depth.

18. A semiconductor memory device comprising:
a semiconductor substrate having a memory area and a peripheral circuit area, said memory area including an SOI region having a buried insulating film and a bulk region, said memory area including,
a contact region formed in the SOI region,
a select gate region formed in the bulk region, and
a memory cell region formed in the SOI region and having plural memory strings each including memory cell transistors interconnected in a first direction, said contact region and said select gate region arranged in a second direction transverse to said first direction;
a first element isolation region having a first depth and formed in the contact region to lust reach the buried insulating film;
a second element isolation region having a second depth and formed in the select gate region; and
a third element isolation region having a third depth and formed in the memory cell region to lust reach the buried insulating film, wherein all depths are measured in a third direction normal to said first and second directions, and wherein the second depth is different from the first and the third depths.

19. The semiconductor memory device according to claim 18,
wherein the second element isolation region is formed so that a bottom thereof is lower than a top surface of the buried insulating film.

20. The semiconductor memory device according to claim 18,
wherein the second element isolation region is formed so that a bottom thereof is lower than a bottom surface of the buried insulating film.

* * * * *